(12) United States Patent
Diemunsch (10) Patent No.: US 10,994,677 B2
(45) Date of Patent: May 4, 2021

(54) BUSBAR INCLUDING A PLURALITY OF COAXIAL SLEEVES PROVIDED WITH ARMS ENDOWED WITH ELECTRICAL TRACKS

(71) Applicant: INSTITUT VEDECOM, Versailles (FR)

(72) Inventor: Guy Diemunsch, Fontaine (FR)

(73) Assignee: INSTITUT VEDECOM, Versailles (FR)

( * ) Notice: Subject to any disclaimer, the term of this patent is extended or adjusted under 35 U.S.C. 154(b) by 317 days.

(21) Appl. No.: 16/084,930

(22) PCT Filed: Mar. 1, 2017

(86) PCT No.: PCT/FR2017/050458
§ 371 (c)(1),
(2) Date: Sep. 13, 2018

(87) PCT Pub. No.: WO2017/158251
PCT Pub. Date: Sep. 21, 2017

(65) Prior Publication Data
US 2019/0071037 A1 Mar. 7, 2019

(30) Foreign Application Priority Data
Mar. 15, 2016 (FR) ...................... 1652194

(51) Int. Cl.
*B60R 16/023* (2006.01)
*H05K 7/14* (2006.01)
(Continued)

(52) U.S. Cl.
CPC ......... *B60R 16/0238* (2013.01); *B60M 1/305* (2013.01); *B60M 1/307* (2013.01); *H05K 7/026* (2013.01); *H05K 7/1432* (2013.01)

(58) Field of Classification Search
CPC ... B60R 16/0238; B60M 1/305; B60M 1/307; H05K 7/026; H05K 7/1432; H02G 5/066
See application file for complete search history.

(56) References Cited

U.S. PATENT DOCUMENTS 3,223,901 A * 12/1965 Riley ...................... H01L 25/03
257/700
3,906,336 A * 9/1975 De Puy ................... H02M 7/08
363/144

(Continued)

FOREIGN PATENT DOCUMENTS

EP 2555408 A1 2/2013

OTHER PUBLICATIONS

International Search Report corresponding to PCT/FR2017050458 dated May 2, 2017.

(Continued)

*Primary Examiner* — Timothy J Thompson
*Assistant Examiner* — Amol H Patel
(74) *Attorney, Agent, or Firm* — Sandberg Phoenix & von Gontard, P.C.

(57) ABSTRACT

The invention relates to a busbar (1) arranged so as to electrically connect at least one power electronic module (13) from at least one electrical conductor (6) to which the busbar (1) can be connected. The busbar (1) comprises a plurality of coaxial sleeves (2). Each of the sleeves (2) comprises a plurality of arms (4) that are distributed peripherally and radially around an axis (A) of the sleeves (2). The arms (4) extend longitudinally in parallel to the axis (A) and each include at least one conductive track (5) forming one of the buses of the busbar (1). The invention also relates to a power electronic module incorporating a busbar in accordance with the invention, and to a vehicle fitted with said module.

18 Claims, 6 Drawing Sheets

(51) Int. Cl.
*H05K 7/02* (2006.01)
*B60M 1/30* (2006.01)

(56) References Cited

U.S. PATENT DOCUMENTS

| | | | |
|---|---|---|---|
| 2013/0143426 A1* | 6/2013 | Fujiwara | H01B 5/02 |
| | | | 439/212 |
| 2015/0155692 A1 | 6/2015 | Hwang et al. | |
| 2016/0284444 A1* | 9/2016 | Naito | B60L 11/1851 |

OTHER PUBLICATIONS

Written Opinion corresponding to PCT/FR2017050458 dated May 2, 2017.

* cited by examiner

BUSBAR INCLUDING A PLURALITY OF COAXIAL SLEEVES PROVIDED WITH ARMS ENDOWED WITH ELECTRICAL TRACKS

The present application is the US National Stage under 35 USC § 371 of International App. No. PCT/FR2017/050458 filed Mar. 1, 2017, which in turn claims the priority of French application 1652194 filed on Mar. 15, 2016, the content of which (text, drawings and claims) is incorporated herein by reference.

TECHNICAL FIELD

The present invention relates to a busbar capable of electrically connecting at least one power electronic module. The invention in particular falls within the field of distributing electric control signals of a multiphase electric system, in particular an electric motor equipping a motor vehicle for the propulsion thereof.

BACKGROUND OF THE INVENTION

In the field of power electronics, a busbar is used to supply an electronic module with electric signals. In general, the busbar is an electrical conductor for distributing a plurality of electric signals received from an input conductor electrically connected to the busbar. The electric signals are respectively conveyed to the electronic module through the busbar by a plurality of electric channels, or buses, comprised by the busbar.

Typically, a busbar includes a rigid support on which electric tracks forming the respective buses are arranged. This typically is a set of three sheets of roll-bonded copper separated by insulators. The electric tracks are able to be electrically connected on the one hand to the at least one input conductor to receive the input electric signal(s), and on the other hand to a plurality of respective output conductors delivering the output electric signals. One interest of busbar therefore lies in grouping several electric tracks, or buses, together that are capable of conveying and delivering each of the respective output electric signals.

Known busbars have a rectilinear shape along which the conductive tracks extend parallel to one another. Another known arrangement of a busbar is a tubular architecture.

The architecture of busbars is generally adapted to their environment and intended use. It is in fact ideal for the busbar to be robust while having a small volume, and to be suitable for allowing it to be installed easily in the environment in which it will be used.

It is also desirable for the busbar to be robust and for its operation to be reliable, in particular in terms of the electrical separation of the different buses.

It is also desirable for the architecture of the busbar to be organized so as to make its connection easy and reliable on the one hand to the input conductor delivering the input electric signal and on the other hand to the different output conductors.

BRIEF SUMMARY

A busbar capable of electrically connecting at least one power electronic module from at least one electrical conductor to which the busbar can be connected is disclosed. Such a module is in particular intended to control the operation of at least one multiphase electric system, more particularly such as an electric motor used for the propulsion of a vehicle, such as a road vehicle or a rail vehicle, for example.

One object of the new busbar is to allow an easy electrical connection to the power electronic module, in particular in the case where the module comprises multiple electronic devices each including a printed circuit board.

Another object of the new busbar is to allow a mechanically reliable and robust connection to the power electronic module.

Another object is to provide effective electrical insulation of the various buses of a busbar in order to give the busbar a reliable operation and prevent risks of failure and/or maintenance operations.

Another object is to make the busbar easier to integrate into a power electronic module, by simplifying the arrangement of the power electronic module.

Another object is to propose a modular configuration for a busbar by making it possible to easily adapt the number of buses that it comprises by limiting the corresponding size.

Another object is to reduce the manufacturing costs of such busbars without affecting the technical effects procured by the proposed solutions in light of the previously stated aims.

According to a first aspect of the busbar, at least one of the aforementioned aims is achieved with a busbar arranged to electrically connect at least one power electronic module from at least one electrical conductor to which the busbar is able to be connected. The busbar includes a plurality of coaxial sleeves, each sleeve including a plurality of arms that are distributed peripherally and radially around an axis (A) of the sleeves, the plurality of arms extending longitudinally parallel to the axis, each arm comprising at least one conductive track forming one of the buses of the busbar.

In other words, the busbar advantageously comprises one or at least two sleeves, preferably assembled together by stepped coaxial fitting. The arms of the busbar are arranged in parallel to one another and thus define an outer enclosure determining the radial size of the busbar.

The arms of the sleeves include conductive tracks to conduct various electric signals toward the power electronic module. Furthermore, the arms of the sleeves are arranged to form mechanical connecting members with the power electronic module.

Preferably, the arms equipping the set of sleeves extend longitudinally along a same direction.

According to one embodiment, the respective arms of at least two sleeves are preferably paired two by two by group, each group of at least two paired arms forming an electrical and/or mechanical connecting means, with at least one of the respective electronic devices of the module.

Each sleeve preferably comprises a base arranged on the one hand to engage with a base of at least one other sleeve, and on the other hand to be able to connect the corresponding sleeve electrically to the at least one electrical conductor. The connecting arms of the busbar as a whole are more particularly radially distributed around the axis of the sleeves, on the periphery of the set of respective bases of the sleeves. The arms of each of the sleeves each comprise at least one conductive track electrically connected to the base.

In this context, the connecting tracks of the arms of a same sleeve in particular have a common electric potential, once the connecting tracks of the arms of the same sleeve are electrically connected to one or several electrical conductors at a same given electric potential.

At least one of the aforementioned aims is achieved from various specific features of the busbar that will be described below, considered alone or in combination.

According to one embodiment, each sleeve is more specifically angularly indexed relative to the other sleeves around the axis of the sleeves. Each arm of each sleeve is paired by separate groups with another arm of each other sleeve. Such indexing is preferably done owing to radial blocking of the sleeves relative to one another, at least two by two, in particular owing to an assembly secured in stepped succession.

By way of non-limiting example, the sleeves can be kept firmly fitted two by two via an attachment means, for example an insulating glue, in order to electrically insulate the sleeves relative to one another, in particular in their fitting zone relative to one another.

At least some of the conductive tracks of the paired arms are advantageously coplanar. More generally, the conductive tracks of each group of paired arms jointly have a flat surface able to be electrically and/or mechanically joined with a flat substrate of the electronic module.

Such a flat substrate is in particular made up of an electronic board equipping an electronic device of the module and receiving the signals delivered by the respective conductive tracks of the paired arms.

Preferably, the conductive tracks of each group of paired arms collectively form the surfaces of a regular polygon.

The number of surfaces of the polygon peripherally corresponds to the number of arms equipping each of the sleeves. It is thus easy to adapt the busbar according to the first aspect based on the electrical needs and/or the shape of the power electronic module and/or the number of electronic devices of the respective module needing to be electrically and/or mechanically connected to the busbar.

The architecture of the busbar is preferably such that two arms of a same group of paired arms are adjacent to respective arms of at least one other group of paired arms.

Advantageously, the conductive tracks of each group of paired arms are collectively electrically connectable to the substrate of an electronic device of the module that is assigned to them.

The electrical connection between the conductive tracks and the substrate of the corresponding electronic device is preferably obtained by surface contact between the track and the substrate.

The surface contact can be direct or indirect. In the latter case, an intermediate material can be inserted between the substrate and the corresponding conductive track in order to improve the electrical connection between them. As an example, this may be a solder.

According to another aspect, the conductive tracks of each group of paired arms are oriented toward the inside or the outside of the volume delimited between the set of arms.

According to a first example, each conductive track of each group of paired arms is oriented toward the outside of the volume located inside the arms. Thus, the arms of the set of sleeves collectively form an axially extended structural assembly that may optionally be housed at least partly inside a power electronic module, and more particularly between the plurality of electronic devices of the module.

According to a second exemplary embodiment, each conductive track of each group of paired arms is oriented toward the inside of the volume delimited by the set of arms. Thus, the arms of the set of sleeves collectively form an axially extended structural assembly that may optionally at least partly envelop a power electronic module, and more particularly at least part of the electronic devices of the module.

Such assemblies thus allow the busbar to be electrically connected to the power electronic module and/or allow the busbar to be mechanically connected to the electronic module. In the latter case, the busbar can thus contribute to stiffening the power electronic module and more particularly to stiffening a mechanical frame that keeps the electronic devices in position relative to one another, thus making it possible to improve the mechanical reliability of such a module, in particular in light of vibrational phenomena and associated mechanical constraints.

According to a third exemplary embodiment, a first set of conductive tracks of a first group of paired arms is oriented toward the inside of the volume previously defined by the set of arms of the busbar; and at least one second set of conductive tracks of a second group of paired arms is oriented toward the outside of the volume delimited by the set of arms of the busbar. The first group of paired arms and the second group of paired arms can be separate or combined. According to this third exemplary embodiment, a first electronic device of the module can be electrically and/or mechanically connected to the first set of conductive tracks and a second electronic device of the module can be electrically and/or mechanically connected to the second set of conductive tracks.

Preferably, at least some of the arms of a sleeve comprise a conductive track extending along at least part of at least one surface of the corresponding arm. Such an arrangement makes it possible to produce surface contact between the surface bearing the conductive track of the at least one part of the arms of the sleeves with a corresponding electronic device and thus to improve the quality of the electrical and/or mechanical connection of the busbar to the module.

According to another specific embodiment, the cross-section of the arms is polygonal, at least one of the surfaces of the polygon comprising at least one conductive track.

Alternatively, according to another specific embodiment, the cross-section of the arms is semicircular, having a flat surface comprising the at least one conductive track.

Advantageously, the arms of each sleeve are regularly angularly distributed around the axis of the sleeves. The plurality of arms of a given sleeve advantageously form a regular polygonal structure in a plane perpendicular to the axis of the sleeves.

Alternatively, the arms are irregularly angularly distributed around the axis of the sleeves. The plurality of arms of a given sleeve then form an irregular polygonal structure in a plane perpendicular to the axis of the sleeves.

Preferably, each sleeve includes a same number of arms. Optionally, according to one alternative that is incompatible with the previous embodiment, at least one sleeve includes a different number of arms from another sleeve, the number of arms associated with each sleeve advantageously being adapted based on the electronic devices of the power electronic module associated with the sleeves and their electrical supply needs.

The base of each of the sleeves may advantageously include a core. Such a core in particular makes up a fitting and/or axial centering member via which the sleeves can successively be fitted two by two.

According to one particular embodiment, the base of at least one of the sleeves includes a plate oriented perpendicular to the axis of the sleeves. The plate advantageously bears arms equipping the sleeve, the arms extending more particularly longitudinally along the axis of the sleeve from a peripheral region of the plate.

More specifically, such a plate makes it possible to move the arms of a given sleeve radially away from the central extension axis of the sleeves. The radial extension of the plate is in particular used to arrange the arms of a group of given paired arms at a same radial distance from the axis of the sleeves. This radial extension also makes it possible to size the inner volume between the arms and as previously defined. The size of the radial extension of the plates respectively equipping the sleeves varies based on the stepped position of sleeves relative to one another and/or the sizes of the power electronic module with which the busbar is capable of collaborating.

Another advantage of such a plate of at least one sleeve of a busbar according to the first aspect is to form a shoulder for positioning the at least one sleeve axially relative to another sleeve with which it cooperates, in particular by fitting.

According to one embodiment, each arm of at least one of the sleeves comprises a bend for connecting to the base. For a given sleeve, such a bend in particular extends between an arm and the base to which it is attached. A bend according to this improvement thus includes a first axial extension part attached to the arm and a second radial extension part located in the extension of the first part and attached to the base. Functionally speaking, the bend and the plate previously defined play similar roles, the bends further having the advantage of being less massive than the plate for a given radial size.

According to one advantageous embodiment of the sleeves, the sleeves are each made up of a single-piece body. In this single-piece version, a sleeve is manufactured according to any known means, for example traditional machining or injection molding, or optionally using more recent techniques such as 3D printing.

According to another improvement, the busbar also includes at least one electric connecting lead secured to at least one sleeve. The electric connecting lead is arranged to electrically connect the at least one conductor to the at least one corresponding sleeve. Functionally, the electric connecting lead is equivalent to an electrical joint connector. Such an electric connecting lead may in particular extend radially past the arms of the sleeves in order to make it easier to connect to the conductor that it receives.

The electrical connection between the conductor and the corresponding electric connecting lead can be done using any known means, and in particular by soldering or screwing.

Preferably, at least two of, and/or each of, the sleeves is equipped with such electric connecting leads for the electrical connection thereof to a conductor that is assigned to them.

According to one possible embodiment, the at least one of the sleeves can be electrically connected to a conductor that is assigned to it via an inner recess. More particularly, the arrangement of the base of the sleeves in a core is advantageously used for such an individual electrical connection via the recess of the corresponding core.

According to one embodiment, the conductive tracks of the arms of each sleeve are at different electric potentials from the tracks equipping the arms of the other sleeves. In this case, the sleeves are electrically insulated from one another. The electrical insulation of the sleeves relative to one another is done using any means, for example via an insulating glue and/or an insulating silicone gel inserted between two sleeves fitted together and/or between the arms of two different sleeves.

According to one embodiment, the sleeves are made from an electrically conductive material on the surface of which an electrically insulating material is deposited in order to insulate the sleeves relative to one another. In this case, the conductive tracks are not covered with the insulating material so that at least some of the arms of a sleeve include an electrically conductive surface able to be connected directly to an electronic device of a power electronic module.

According to one particular embodiment, an electrically insulating material is deposited between at least two respective arms of two different sleeves, and preferably between the arms of each sleeve on the one hand, and/or between the bases of each sleeve on the other hand. Such an electrical insulator can for example assume the form of an insulating silicone gel or of any other dielectric material able to be introduced easily between the sleeves and making it possible to prevent an electric arc from forming between the respective arms of the different sleeves.

Various arrangements of the sleeves can be considered depending on the number of output electric signals to be provided by the busbar to the module.

More generally, the busbar comprises a number of sleeves and/or electric connecting leads equal to the number of conductors electrically connected to the busbar, the number of conductors depending on the number of different electric potentials that are applied individually to each sleeve.

For example, the busbar may include two sleeves each including three arms distributed at 120° around the axis of the sleeves. The arms form a triangle between them in the plane perpendicular to the axis of the sleeves. A first sleeve is in particular configured according to a first electric potential and a second sleeve is configured at a second electric potential, optionally different from the first electric potential.

Alternatively, the busbar may also include three sleeves each including six arms distributed at 60° around the axis of the sleeves. The arms form a hexagon between them in the plane perpendicular to the axis of the sleeves. A first sleeve is configured according to a first electric potential, a second sleeve being configured at a second electric potential and a third sleeve being configured at a third electric potential. The first electric potential, the second electric potential and the third electric potential may optionally all be different.

According to a second aspect, a power electronic module is proposed including a plurality of electronic devices electrically connected to a busbar according to a first aspect or to any one of its improvements. More particularly, the electric connection between the busbar and the at least one electronic device is in particular established via at least one conductive track of at least one of the arms of at least one sleeve.

The module may advantageously include a plurality of electronic devices collaborating with a group of corresponding paired arms of the busbar, the plurality of electronic devices respectively being connected to at least one conductive track of at least one group of corresponding arms of at least one sleeve.

According to one advantageous embodiment, at least one electronic device, and preferably each electronic device, comprises a substrate supporting electronic components, each electronic device being arranged in a printed circuit board, and the busbar being connected to at least some of the electronic devices, and preferably to each electronic device, via a connection between the corresponding substrate of the electronic devices and at least one conductive track.

The connection between the substrate of an electronic device and the conductive track of a busbar according to the first aspect or to any one of its improvements may alternatively or additionally be an electrical connection and/or a mechanical connection.

Preferably, the connection between the substrate of an electronic device and a conductive track is a solder.

Thus, the electrical connection between the busbar according to the first aspect and the module according to the second aspect is done more simply. Furthermore, the accumulation of such an electrical connection with a mechanical connection between an electronic device and the busbar makes it possible to guarantee a lasting and optimal operation of the busbar and/or the power electronic module, while in particular guaranteeing that the electric signals are indeed transferred from the electrical conductor to the power electronic module, without electrical interference and/or electric arcs and/or short-circuits.

The at least one electronic device of a power electronic module according to the second aspect can extend longitudinally inside or outside the volume delimited by the set of arms of the sleeves of a busbar.

Advantageously, the busbar according to the first aspect being able to be mechanically connected to the various electronic devices, it forms a member for mechanically securing the electronic devices together, the securing member being integrated into the power electronic module, and it thus participates in improving the rigidity, solidity, reliability and robustness of such a power electronic module. The structural organization of the power electronic module is simplified as a result. The secured assembly including the electronic devices secured together via the busbar can thus be manipulated via the busbar, in particular to install the module and/or the secured assembly in their usage environment.

The busbar and/or the module are in particular useful in the context of managing the operation of a propulsive electric motor of a vehicle with an at least partially electric motor means, such as a road vehicle or rail vehicle, for example.

In this context, and according to a third aspect, a set of components is proposed including an electric motor and a power electronic module according to the second aspect or to any one of its improvements. Such a set of components is in particular organized such that the electric motor is controlled by the power electronic module.

According to a fourth aspect, a motor vehicle is proposed that is equipped with a set of components according to the third aspect.

The vehicle is in particular a wholly or partially electrically propelled vehicle, the electric motor being a propulsion motor of the vehicle.

Various embodiments of the invention are provided, incorporating the various optional features set out in this document according to all possible combinations thereof.

Of course, the targeted applications of the busbar, the power electronic module, the set of components and the vehicle do not hinder other possible applications of the busbar according to the invention, the power module, the set of components and the vehicle, as long as the technical results, considered alone or in combination, that they procure together or respectively are useful for such other applications.

DESCRIPTION OF THE FIGURES AND EMBODIMENTS

Still other features and advantages of the invention will appear through the following description on the one hand, and several embodiments provided for information and non-limitingly in reference to the appended schematic drawings on the other hand, in which.

The embodiments that are described below are in no way limiting; it is in particular possible to develop alternatives comprising only a selection of the features described below isolated from the other described features, if this selection of features is sufficient to impart an advantage and/or a technical effect, or to differentiate the busbar from the prior art. This selection may include at least one preferably functional feature without structural details, or with only some of the structural details if only this part is sufficient to impart an advantage and/or a technical effect, or to differentiate the invention from the prior art.

In particular, all of the improvements and all of the embodiments described can be combined with one another if nothing opposes this combination technically and/or if this combination procures a solution to at least any one of the aims sought by the invention.

To avoid overloading the figures, to make them easy to read and to clarify their description, the elements shared by several figures retain the same references, in both their depiction and description, without being depicted individually and/or specified in each of the figures, or having an identical arrangement of the common members between and specific embodiments.

Figures 1, 2:
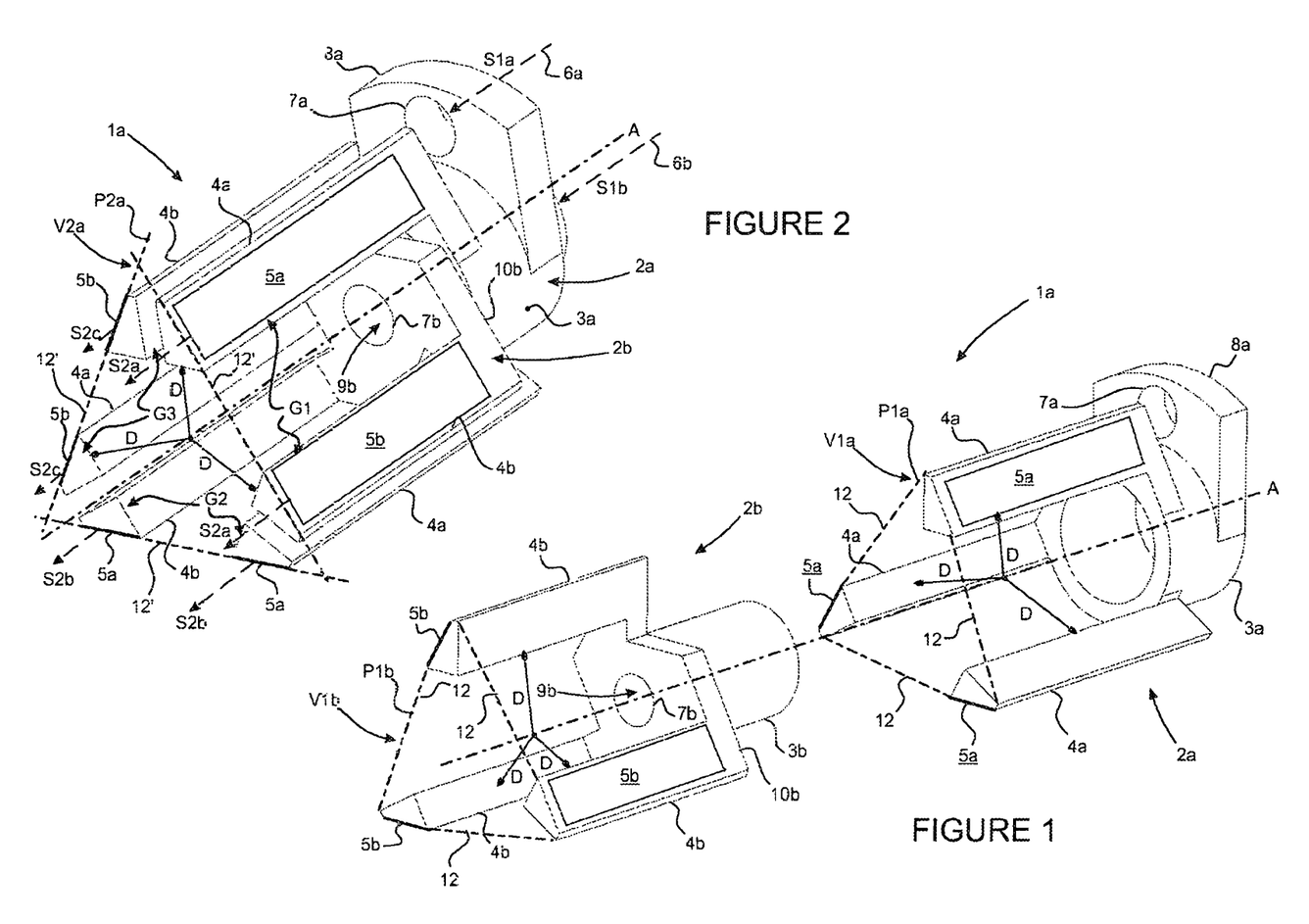
FIG. 1 and FIG. 2 are perspective illustrations of an exemplary embodiment of a busbar according to the first aspect, in exploded view and assembled view, respectively.
Figures 3, 4, 5:
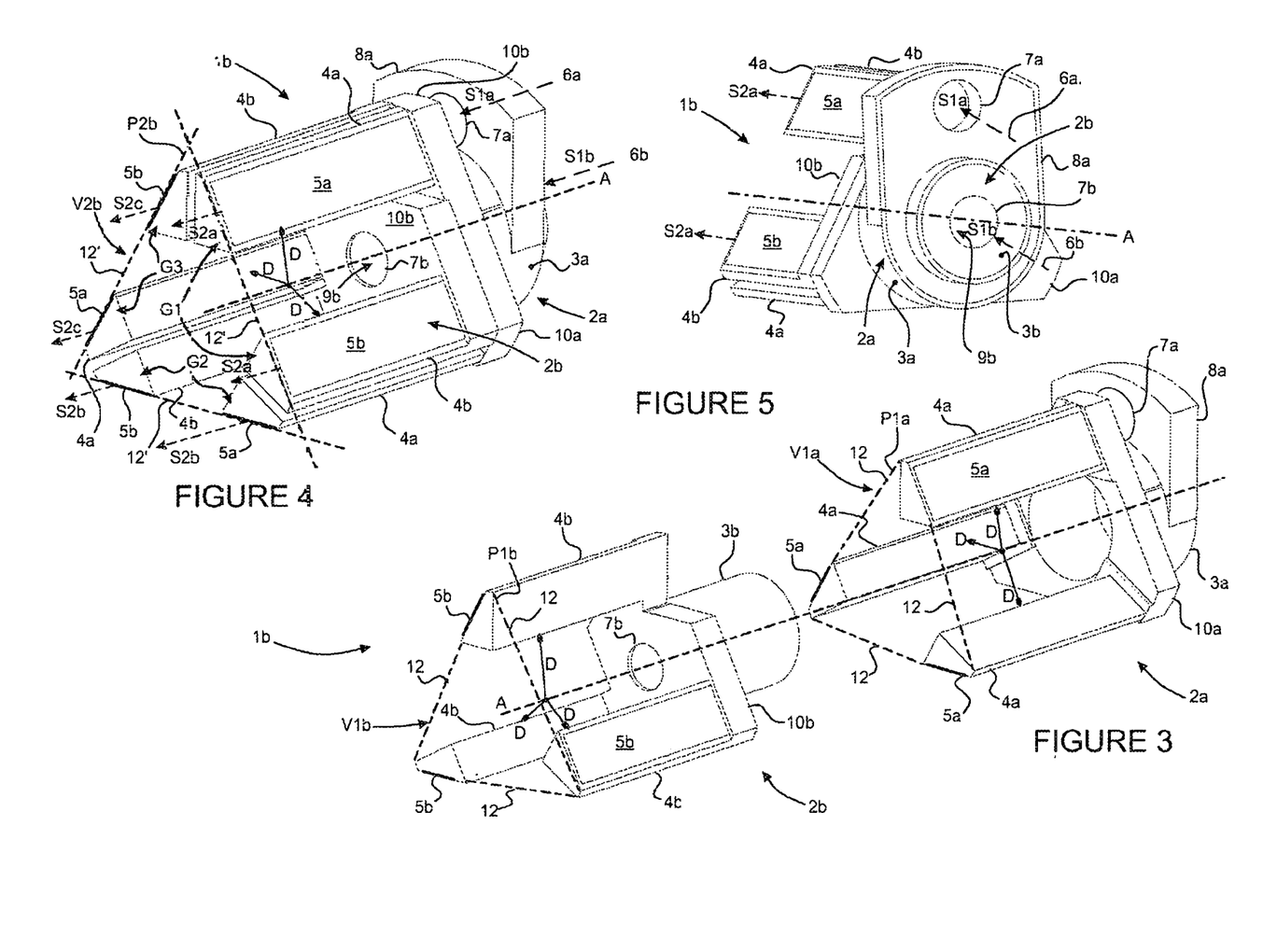
FIG. 3, FIG. 4, and FIG. 5 are perspective illustrations of another exemplary embodiment and of a busbar, in exploded view, assembled view, and end view, respectively.

Example embodiments of busbars according to the first aspect of the present invention are respectively illustrated in:

FIGS. 1 and 2 for an example embodiment of a first busbar 1a,

FIGS. 3, 4 and 5 for an example embodiment of a second busbar 1b, and

Figure 6:
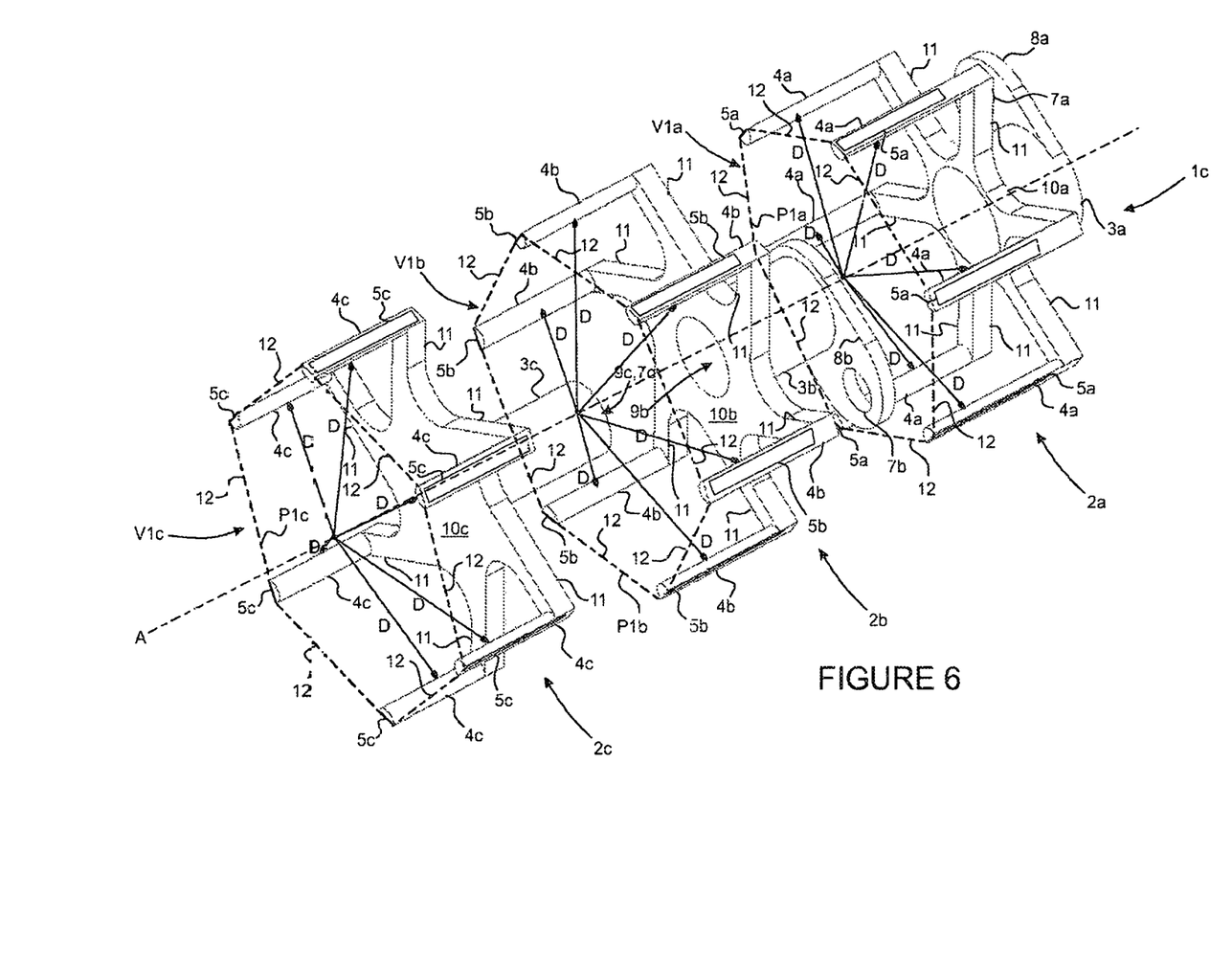
FIG. 6 and FIG. 7 are perspective illustrations of another exemplary embodiment of a busbar, in exploded view and assembled view, respectively.
Figure 7:
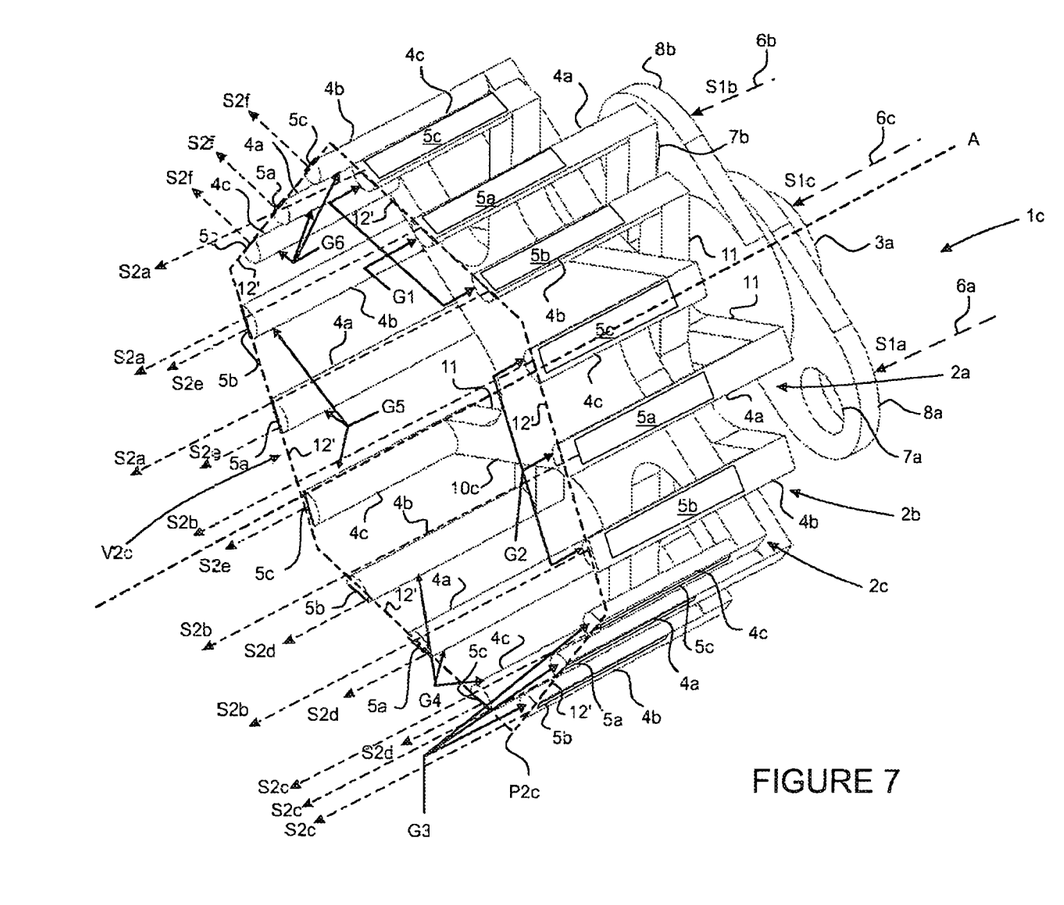

FIGS. 6 and 7 for example embodiments of third busbar 1c.

These exemplary embodiments are indicated to illustrate the various features of the invention, and are in no way limiting regarding the possible embodiments of a busbar according to the invention.

In reference to FIGS. 1 to 7, a busbar 1a, 1b, 1c comprises a plurality of coaxial sleeves 2a, 2b, 2c securely fitted together in pairs. A sleeve is defined here as being a member extending longitudinally along an axis referred to as sleeve axis A. A volume V1a, V1b, V1c is thus delimited by the various longitudinal walls of a sleeve and will be described in detail below. In general, the volume V1 thus created by the shape of the sleeve assumes the general form of a hollow cylinder, the peripheral walls of which extend axially, the peripheral walls being radially discontinuous, assuming the form of arms extending along the axis A and delimiting the volume V1.

More particularly, each of the sleeves 2 of a given busbar 1 comprises a base arranged to be able to collaborate with a base of another sleeve, in particular to align them and/or center them. In particular, the base of the sleeve includes a core 3a, 3b, 3c to fit it inside a core 3 of another coaxial sleeve 2. Each of the sleeves 2 comprises a plurality of arms 4a, 4b, 4c secured to the core 3 delimiting the hollow volume V1 previously defined between them.

The arms 4 extend longitudinally parallel to one another and in parallel to the axis A of the sleeves 2, such that the arms 4 are arranged on the periphery of the set of sleeves 2. Each arm 4 of each of the sleeves 2 comprises at least one electrically conductive track 5a, 5b, 5c forming one of the buses of the busbar 1.

The sleeves 2 are successively fitted in one another via the bases and the cores 3 that they respectively comprise. More particularly, the core 3 of a first axial end sleeve 2a of the busbar 1 receives the core 3b of a second sleeve 2b in its inner recess. Thus, the sleeves are axially assembled to one another in successive stages.

In the example of the busbar 1c illustrated in FIGS. 6 and 7, the core 3b of the second sleeve 2b, making up an intermediate sleeve, receives the core 3c of a third sleeve 2c that preferably extends axially along the core 3b of the second sleeve 2b and the first sleeve 2a.

In the examples of the respective busbars 1 shown in FIGS. 1 to 7, the sleeves 2 are secured together, while being individually connected in rotation so as to define a particular radial orientation of each sleeve 2 relative to the other sleeves 2.

From such an arrangement rule, the busbar 1 may include any number N of sleeves 2 successively fitted two by two.

Preferably, the number of sleeves of the busbar is easily adapted based on the number of electric signals S2a-S2f to be transferred from at least one conductor 6 toward the at least one electronic device connected to the busbar. This adaptation can be done easily without major structural modifications of the busbar or without causing a significant variation in its axial and/or radial size.

The sleeves 2 can be connected to at least one input electrical conductor 6a, 6b, 6c delivering an input electric signal S1a, S1b, S1c to the busbar 1. In the illustrated exemplary embodiment, each sleeve 2 is provided with an electric connecting member 7a, 7b, 7c to a conductor 6 delivering an input electric signal S1a, S1b, S1c with a given electric potential. The electric potentials of the input electric signals S1a, S1b, S1c respectively delivered to the sleeves 2 by the conductors 6 that are respectively assigned to them are able to be at the same electric potential, or may alternatively be partially or completely different.

Indeed, it may be useful to differentiate the electric potentials of the input electric signals S1a, S1b, S1c, in particular in the context of a busbar dedicated to delivering electric signals intended to be injected into a power electronic module in order to control at least one multiphase electric system. In such a case where each sleeve is at a different electric potential, it is essential for the sleeves 2 to be electrically insulated from one another for a proper operation of the busbar.

To that end, an insulating material is wisely arranged at the interface between each sleeve. The desired objective is to prevent any electrical contact between two sleeves on each of which an electric potential is applied, above all if it is different, and/or to prevent an electric arc phenomenon between two sleeves.

According to one embodiment, the sleeves 2 are covered with electrically insulating material, the conductive tracks 5 advantageously being able to be made along the arms 4 by zones on which the electrically insulating material is not deposited 4.

The electric connecting member 7a, 7b, 7c is arranged on the core 3 of the sleeves 2, while for example being formed by a connecting lead 8a, 8b arranged on the joint connector or while being formed by the recess 9b, 9c of the core 3b, 3c.

For example, for the busbar 1a illustrated in FIGS. 1 and 2 and for the busbar 1b illustrated in FIGS. 3, 4 and 5, a first axial end sleeve 2a of the busbar 1a, 1b is provided with a lead 8a arranged in a joint connector to be connected to a first conductor 6a. A second sleeve 2b is fitted in the recess of the first sleeve 2a.

The second sleeve 2b is able to be connected to a second conductor 6b, using its recess 9b or if applicable using its peripheral surface optionally emerging radially outside the first sleeve 2a.

According to another embodiment illustrated in FIGS. 6 and 7, a first axial end sleeve 2a of the busbar 1c is provided with a first connecting lead 8a arranged in a joint connector to be connected to a first conductor 6a. A second sleeve 2b is fitted axially in the recess 9a of the core 3a of the first sleeve 2a, the second sleeve 2b preferably bearing flat on the first sleeve 2a. The second sleeve 2b is provided with a second connecting lead 8b arranged in the joint connector to be connected to a second conductor 6b. The second connecting lead 8b is preferably located in a different angular position from the first connecting lead 8a. As a non-limiting example, the first and second connecting leads 8a, 8b are angularly separated from one another by 180°.

In the examples of busbars 1 respectively shown in FIGS. 1 to 7, the sleeves 2 each comprise a base bearing respective arms 4 of the sleeves 2. The base includes at least part of the core 3 and may include a plate 10a, 10b, 10c mechanically secured to the core 310. Electrically speaking, all of the component elements of such sleeve are preferably connected, the sleeve having a substantially identical electric potential over all of its component elements.

In the example of the busbar 1a illustrated in FIGS. 1 and 2, the arms 4a of the first axial end sleeve 2a of the busbar 1a are supported directly by the core 3a of the first sleeve 2a. The core 3b of the second sleeve 2b is provided with a plate 10b inserted radially between the arms 4b in the core 3b of the second sleeve 2b that supports them.

In the examples of the busbars 1b and 1c respectively illustrated in FIGS. 3, 4 and 5 on the one hand, and FIGS. 6 and 7 on the other hand, the core 3 of each sleeve 2 comprises a plate 10 radially inserted between the core 3 and the arms 4 of the sleeve 2 that supports them. The plates 10 are in particular oriented perpendicular to the axis A of the sleeves 2, and leave a central axial recess between the arms of each sleeve 2 of the busbar 1b, 1c.

The busbars illustrated in FIGS. 3, 4 and 5 in particular include an insulating material on the surface of each sleeve, and more particularly on at least part of the surfaces of each arm.

The plate 10 equipping a given sleeve 2 procures a triple function. Each of the functions can be considered and implemented alone.

A first function of the plates 10b, 10c is to form a shoulder of the sleeves 2b, 2c, forming an axial positioning and/or axial stop member of a given sleeve 2b, 2c relative to the sleeve 2a, 2b and/or against the sleeve 2a, 2b with which the given sleeve 2b, 2c cooperates, preferably by interlocking.

A second function of the plates 10 is to arrange the arms 4 of the sleeves 2 at a desired radial distance D from the axis A of the sleeves 2. The radial distance D separating the arms 4 of the various sleeves 2 from their axis A determines the radial extension of the volume V2a, V2b, V2c or cage that the set of arms of the busbar 1 delimits between them.

A third function of the plates 10 is to distribute the arms 4 of the sleeves 2 angularly around the axis A of the sleeves, and preferably homogeneously, the angle between two successive arms 4 of the same sleeve 2 being constant for all of the arms 4.

As described later, the second and third functions of the plates 10 are in particular used to arrange at least one group G1-G6 of at least two paired arms 4 of respective sleeves 2 at a same radial distance D from the axis of the sleeves 2. The arms 4 of different groups G1-G6 of paired arms 4 can be arranged at a distance D from the axis A different from that of the arms 4 of the other groups G1-G6 of paired arms 4. The arms 4 of each sleeve 2 of a busbar 1 are preferably angularly distributed around the axis A with a same spacing, each sleeve 2 being angularly offset relative to the other sleeves 2 so as to form the different groups G1-G6 of paired arms 4.

Dependent on the desired use of a busbar according to the first aspect of the invention, at least one of the arms 4 of at least one sleeve 2 is capable of being placed at a distance D from the axis A different from that of at least one of the arms 4 of at least one sleeve 2.

Thus, in the illustrated examples, the radial distance D between the set of arms 4 equipping the busbars 1 and the axis A of the sleeves 2 is advantageously identical.

In the example of the busbar 1c illustrated in FIGS. 6 and 7, the arms 4 of a given sleeve 2 can be bent at their lower part in connection with the base of the corresponding sleeve 4, in order to limit the weight of the sleeve 2 and more particularly to reduce the weight of the corresponding plate 10. Thus, the bent parts 11 of the arms 4 thus illustrated comprise a first axial extension part attached to the arms 4 and a second radial extension part located in the extension of the first part and attached to the base 42.

The bends 11 of the arms 4 procure the same advantages, and more particularly the same functions, as the plates 10. The busbar 1c according to the first aspect may include, alone or in combination, the plates 10 and/or a bent arrangement of the arms 4.

According to the various exemplary embodiments of the illustrated busbars 1, the arms 4 are electrically connected to the core 3a, 3b, 3c of the sleeve 2 that bears them. The input electric signals S1a, S1b, S1c are thus conveyed from the core 3a, 3b, 3c to which the arms 4 are mechanically secured to the conductive track 5 unless the arms 4 respectively comprise. In general, each sleeve is generally at a given electric potential.

As long as the input electric signals S1a, S1b, S1c are at different electric potentials, the arms 4 of a given sleeve 2 and their respective conductive tracks 5 are at a same electric potential, different from the respective electric potential(s) of the arms 4 of the other sleeves 2 and conductive tracks 5 that the arms 4 of the other sleeves 2 respectively comprise.

Thus, the core 3a, 3b, 3c and the arms 4 of a given sleeve 2 are preferably securely mechanically connected together and thus electrically connected together. As previously described, such an electrical and/or mechanical connection between the arms 4 and the cores 3 that respectively bear them can in particular advantageously be done by joining the arms 4 to the core 3, if applicable via a plate 10, in contact via their material in particular derived from an electrically conductive material.

The arms of the sleeve can be made by molding and/or deformation of at least one sheet cut to form at least one of the components of the sleeves. Alternatively, the arms of the sleeve can be securely fastened on the base by any assembly means, for example, by assembly screws or by gluing or soldering.

According to the exemplary embodiments of the busbars 1 respectively illustrated in FIGS. 1 to 7, the arms 4 of each of the sleeves 2 are regularly angularly distributed around the axis A of the sleeves 2. The plurality of arms 4 of a given sleeve 2 thus delimits the transverse profile of its volume V1 formed between the arms 4.

The plurality of arms 4 advantageously forms a first polygon P1a, P1b, P1c. The transverse profile of the volume V1 is defined in a plane perpendicular to the axis A of the sleeves 2. Each surface 12 of the first polygon P1a, P1b, P1c is delimited by at least two adjacent arms 4 of the same sleeve 2.

Furthermore, each sleeve 2 comprises a same number of arms 4.

Consequently, the first polygons P1a, P1b, P1c respectively delimited by the arms 4 of each sleeve 2 have a same geometry. More particularly, the first polygons P1a, P1b, P1c respectively delimited by the arms 4 of the sleeves 2 are homothetic.

According to a first example, busbar 1a illustrated in FIGS. 1 and 2 and for the busbar 1b illustrated in FIGS. 3, 4 and 5, the busbars 1a, 1b each comprise two sleeves 2a, 2b. Each sleeve 2a, 2b comprises three arms 4a, 4b distributed at 120° around the axis A of the sleeves 2a, 2b. The first polygons P1a, P1b respectively formed by the arms 4a, 4b of one and the other of the sleeves 2a, 2b of the busbars 1a, 1b are then each of the triangle type, and preferably of the equilateral triangle type, the first polygons P1a, P1b more particularly being homothetic.

According to a second exemplary busbar 1c illustrated in FIGS. 6 and 7, the busbar 1c includes three sleeves 2 each including six arms 4 distributed at 60° around the axis A of the sleeves 2. The first polygons P1a, P1b, P1c respectively formed by the arms 4 of each of the sleeves 2 are then of the hexagon type, and preferably of the regular hexagon type, in particular, the first polygons P1a, P1b, P1c more particularly being homothetic.

In the exemplary embodiments of busbars 1 respectively illustrated in FIGS. 1 to 7, the sleeves 2 are angularly indexed relative to one another, such that each arm 4 of each sleeve 2 is paired, by separate groups G1-G6 of paired arms 4, with another arm 4 of each other sleeve 2. It will be noted the two arms 4 of the same group of paired arms 4 are adjacent to respective arms 4 of at least one other group G1-G6 of paired arms 4.

Each group G1-G6 of paired arms 4 is capable of forming an electrical and/or mechanical connecting means with at least one electronic device 14a, 14b, 14c of a power electronic module 13a, 13b, 13c electrically and/or mechanically coupled with the busbar 1. The power electronic module 13 then receives respective first output electric signals S2a-S2f of each group G1-G6 of paired arms 4.

Preferably, each arm 4 of a group G1-G6 of paired arms 4 is at a different electric potential, thus making it possible to supply, locally and along an orientation defined by the surface of the polygon thus formed, a plurality of electric potentials to a corresponding electronic device.

Indeed, each arm 4 includes at least one flat surface provided with a conductive track 5 extending along the majority of its surface. The set of conductive tracks 5 of the busbar 1 is preferably oriented toward the outside of the volume V2a, V2b, V2c delimited between the set of arms 4 equipping the busbar 1.

In reference to FIGS. 1 and 2, the cross-section of the arms 4 is substantially polygonal, and more particularly of the triangle type. At least one of the flat surfaces forming the triangle is provided with at least one conductive track 5. In reference to FIGS. 6 and 7, the cross-section of the arms 4 is semicircular, a flat surface comprising at least one conductive track 5.

The flat surfaces of the arms 4 comprise the conductive tracks 5 collectively delimiting a polygonal profile of the volume V2a, V2b, V2c in a plane perpendicular to the axis A of the sleeves. More particularly, the surfaces 12' of a second polygon P2a, P2b, P2c are respectively delimited by the conductive tracks 5 of the arms 4 of the groups G1-G6 of paired arms 4.

Each group G1-G6 of paired arms 4 thus comprises a group of conductive tracks 5, which are preferably coplanar, delimiting one of the surfaces 12' of the second polygon P2a, P2b, P2c.

Each group of conductive tracks 5 is able and arranged to be electrically connected to an electronic device of the module. Such an electrical connection can preferably be made by surface contact of a substrate with at least one electronic device of the power electronic module against one of the conductive tracks of a corresponding group G1-G6 of paired arms 4.

Figures 8, 9:
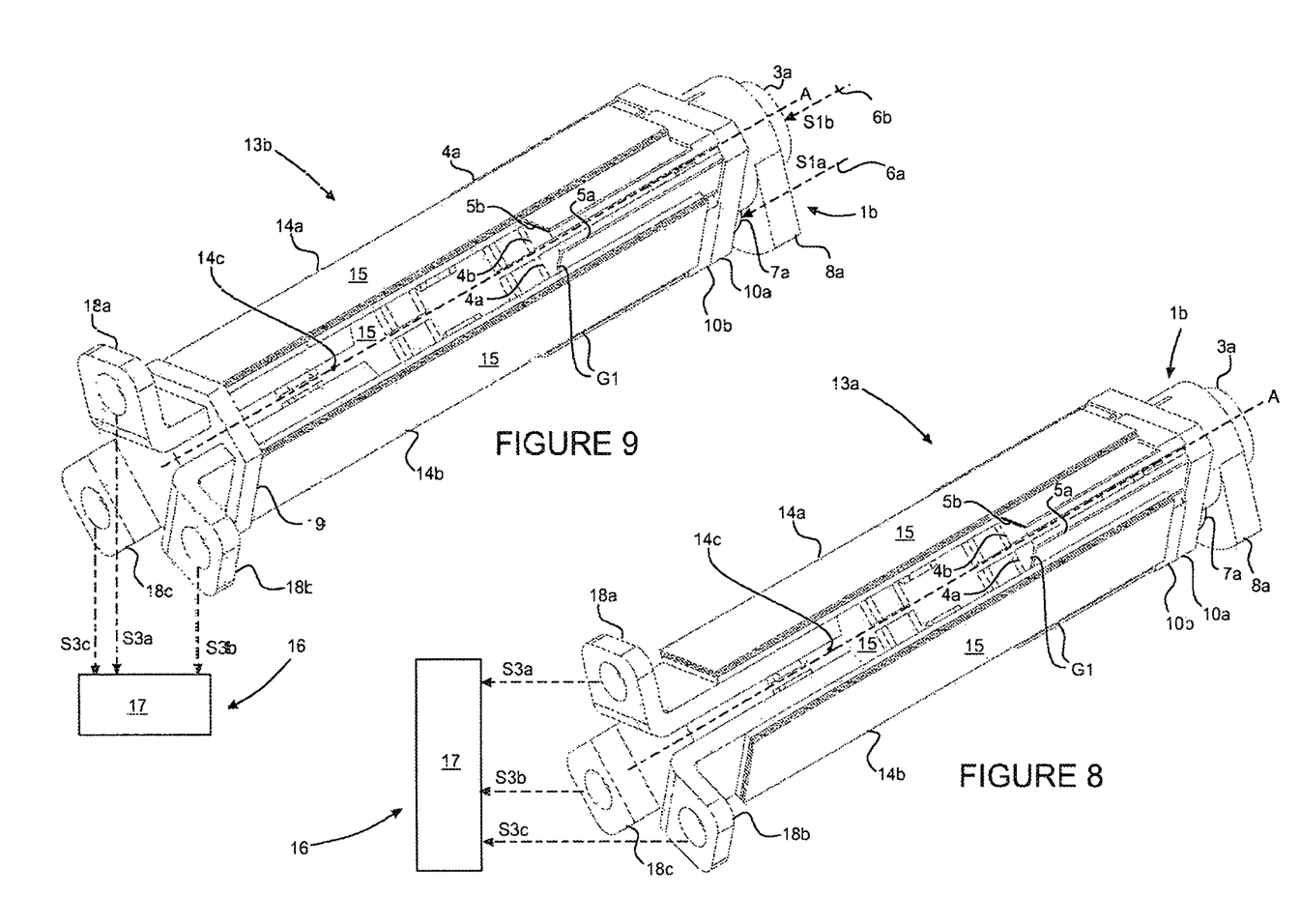
FIG. 8 and FIG. 9 are perspective illustrations of an exemplary embodiment of a power electronic module, according to respective alternative embodiments.
Figures 10, 11:
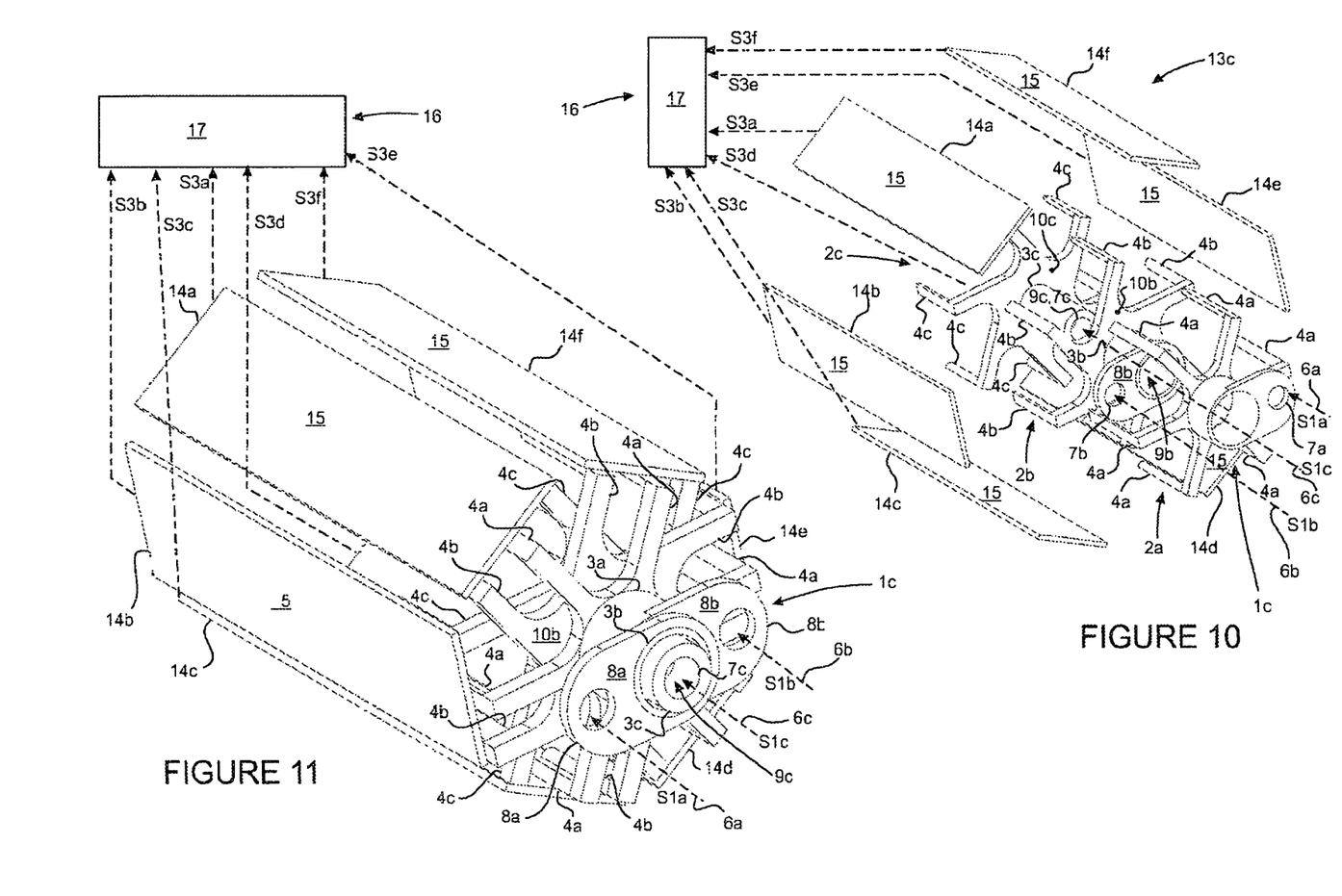
FIG. 10 and FIG. 11 are perspective illustrations in exploded view and assembled view, respectively, of another exemplary embodiment of a power electronic module.

More particularly, FIG. 8 and FIG. 9, as well as FIGS. 10 and 11, illustrate examples of a power electronic module 13 according to the second aspect of the invention. The module 13 includes electronic devices 14a-14f to which a busbar 1b, 1c according to the first aspect is connected. The connection between the busbar 1b, 1c and the electronic devices 14a-14f is at least electrical, and also advantageously mechanical.

To that end, each electronic device 14a-14f of a module 13 can assume the form of a printed circuit board 15 comprising a substrate on which at least one electronic component is installed. For example, the module 13 is a control module of at least one multiphase electric system 16, such as a propulsive electric motor 17 of a vehicle.

The electronic components of each electronic device 14a-14f are for example arranged and configured to form an arm of an inverter. To that end, for example, they include at least two insulated gate bipolar transistors, each transistor being associated with a diode. From first output electric signals S2a-S2f delivered to the electronic devices 14a-14f by the groups G1-G6 of paired arms 4 of the busbar, respectively, the power electronic module forms the first output electric signals S2a-S2f so as to be able to control the operation of at least one multiphase electric system 16.

As a non-limiting example, the electronic devices 14a-14f can be of the DC-DC converter type, such as choppers. The electric signals respectively delivered to the electronic devices 14a-14f by the busbar 1 according to the first aspect are, for non-limiting information, of the direct voltage type, the rated value of which is comprised between 150V and 600V. The second output electric signals S3a-S3f formed by the power electronic module 13 are of the Pulse Width Modulation (PWM) type. Each electronic device 14a-14f performs such a conversion with a given frequency and duty ratio. Preferably, each second output electric signal S3a-S3f is phase-shifted relative to the other output electric signals S3a-S3f.

The conductive tracks 5 of each group G1-G6 of paired arms 4 are jointly electrically and/or mechanically connected to the substrate of a corresponding electronic device 14a-14f, by sealing using an electrically conductive material in particular by soldering, for example.

The conductive tracks 5 of each group G1-G6 of paired arms 4 are advantageously coplanar and can thus easily be placed in electrical contact with respective conductive tracks 5 of the electronic board 15 of the electronic device 14a-14f allocated to them.

The busbar 1 according to the first aspect of the invention is then arranged to form a member integrated into the power electronic module 13 and bearing electronic devices 14a-14f that it comprises. The arms 4 of the busbar 1 thus jointly form members arranged on the one hand to assemble the electronic devices 14a-14f together and on the other hand to assemble the busbar 1 to the electronic devices 14a-14f.

More particularly, and as illustrated in FIGS. 8 to 11, the electronic devices 14a-14f all extend longitudinally parallel to the axis A of the sleeves 2. The electronic devices 14a-14f are arranged such that they include a surface oriented radially toward the outside of the busbar 1b, 1c, more particularly radially toward the outside of each of the arms 4 of a group G1-G6 of paired arms 4 that is individually allocated to them.

According to other configurations of the module 13, the orientation of the electronic devices 14a-14f can be toward the inside and/or toward the outside of the volume V2a, V2b, V2c of the busbar 1 delimited between the arms 4. Indeed, the electronic devices 14a-14f may for example be located radially toward the outside of the volume V2a, V2b, V2c. Also for example, one or several electronic devices 14a-14f may be located radially toward the inside of the volume V2a, Vb2, V2c and one or several other electronic devices 14a-14f may be located radially toward the outside of the volume V2a, V2b, V2c.

This particular implantation of the electronic devices 14a-14f, and more particularly that for which the electronic devices 14a-14f are located radially at least partially inside the volume V2a, V2b, V2c delimited between the arms 4, makes it possible to limit the size of the power electronic module 13 and to limit the risks of chance pulling out of the electronic devices 14a-14f during the manipulation of the power electronic module 13.

The electronic devices 14a-14f are individually securely fastened at a first of their longitudinal ends on the arms 4 of the groups G1-G6 of paired arms 4 that are respectively assigned to them.

As previously described, the fastening of the electronic devices on the arms 4 of the busbar is advantageously done by soldering.

In the examples respectively illustrated in FIG. 8 and FIG. 9, the power electronic module 13a, 13b is equipped with a connector 18 delivering different second output electric signals S3a, S3b, S3c that are respectively provided by the electronic devices 14a, 14b, 14c. The second output electric signals S3a, S3b, S3c are in particular intended to power the multiphase electric system 16 to be controlled, for example an electric motor, in particular for a motor-driven vehicle. The connector 18 advantageously includes output connecting members 18a, 18b, 18c arranged individually on a joint connector and respectively electrically and/or mechanically connected to a corresponding electronic device 14a, 14b, 14c.

More specifically, the electronic devices 14a, 14b, 14c are each provided with an output connecting member 18a, 18b, 18c at their second longitudinal end, longitudinally opposite their first longitudinal end. The connecting members 18a, 18b, 18c are at least electrically and preferably also mechanically connected to the substrate 15 of the corresponding electronic device 14a, 14b, 14c.

For example, as illustrated in FIG. 8, the connector 18 is made up of a set of output connecting members 18a, 18b, 18c securely fastened to a first longitudinal end of the substrate 15 of the corresponding electronic devices 14a, 14b, 14c, for example using a solder.

Also for example as illustrated in FIG. 9, the connector 18 includes, on the one hand, the output connecting members 18a, 18b, 18c, and on the other hand an end piece 19 securely fastened to a second longitudinal end of the substrate of the electronic devices 14a, 14b, 14c, thus making it possible to maintain the shape of the power electronic module 13a, 13b by keeping each of the electronic devices 14a, 14b, 14c in their particular relative arrangement with respect to one another, and in particular according to the polygonal configuration previously described.

The end piece 19 may in particular at least partially include an electrically insulating material and/or be covered with an electrically insulating material so as to prevent any electrical contact of the output connecting members 18a, 18b, 18c with one another. The output connecting members 18a, 18b, 18c longitudinally pass through the end piece 19 from the substrates 15 of the corresponding electronic devices 14a, 14b, 14c toward the outside of the module 13a, 13b.

Such measures described regarding the arrangement of the connector 18, in relation to the exemplary embodiments respectively illustrated in FIG. 8 and FIG. 9, can be transposed to the example embodiment illustrated in FIGS. 10 and 11.

Such measures relative to the organization of the electric connecting means of the electronic devices 14a-14f are provided as an example and are not limiting with respect to other possible terms for providing electric connecting means of the electronic devices 14a-14f with the outside of the module 13, in particular for its electric connection with the multiphase electric system 16.

Thus, the invention is of course not limited to the examples that have been described above, and many developments can be made to these examples without going beyond the scope of the invention. In particular, the various features, forms, alternatives and embodiments of the various busbars 1 according to the first aspect of the invention and power electronic modules 13 according to the second aspect of the invention and previously described can be associated with one another, alone or in combination, according to various alternatives as long as they are not incompatible or mutually exclusive.

The invention claimed is:

1. A busbar arranged to electrically connect at least one power electronic module from at least one electrical conductor to which the busbar is able to be connected, wherein the busbar includes a plurality of coaxial sleeves, each sleeve including a plurality of arms that are distributed peripherally and radially around an axis of the sleeves, said plurality of arms extending longitudinally parallel to the axis, each arm comprising at least one conductive track forming one of the buses of the busbar.

2. The busbar according to claim 1, wherein each sleeve comprises a base arranged on the one hand to engage with a base of at least one other sleeve, and on the other hand to be able to connect the corresponding sleeve electrically to the at least one electrical conductor.

3. The busbar according to claim 2, wherein the arms of at least one of the sleeves each comprise a bend for connecting to the base.

4. The busbar according to claim 1, wherein for each sleeve, the arms are regularly angularly distributed around the axis of the sleeves, the plurality of arms of a given sleeve forming a regular polygonal structure in a plane perpendicular to the axis of the sleeves.

5. The busbar according to claim 1, wherein the base of at least one of the sleeves includes a plate oriented perpendicular to the axis of the sleeves and bearing arms equipping said sleeve.

6. The busbar according to claim 1, wherein the conductive tracks of the arms of each sleeve are at different electric potentials from the tracks equipping the arms of the other sleeves, the sleeves being electrically insulated from one another.

7. The busbar according to claim 1, wherein the busbar includes two sleeves each including three arms distributed at 120° around the axis of the sleeves while forming a triangle in the plane perpendicular to the axis of the sleeves, a first sleeve being configured according to a first electric potential and a second sleeve being configured at a second electric potential.

8. The busbar according to claim 1, wherein the busbar includes three sleeves each including six arms distributed at 60° around the axis of the sleeves while forming a hexagon in the plane perpendicular to the axis of the sleeves, a first sleeve being configured according to a first electric potential, a second sleeve being configured at a second electric potential and a third sleeve being configured at a third electric potential.

9. A power electronic module, the power module including a busbar according to claim 1 and a plurality of electronic devices respectively connected to at least one conductive track of said busbar.

10. The power electronic module according to claim 9, wherein each electronic device cooperates with a group of paired arms of the busbar, said electronic devices respectively being connected to the conductive tracks of the corresponding group of arms.

11. The power electronic module according to claim 10, wherein the connection between a substrate of each electronic device and the busbar is a mechanical connection.

12. The power electronic module according to claim 9, wherein said at least one electronic device extends longitudinally outside the volume delimited by the set of arms.

13. A motor vehicle equipped with an assembly including an electric motor and a power electronic module according to claim 9, wherein the electric motor is controlled by the module.

14. The busbar according to claim 1 wherein each sleeve includes a base; said plurality of arms extending from said base, wherein the base of one sleeve of said plurality of coaxial sleeves cooperates with the base of another sleeve of said plurality of coaxial sleeves to align the plurality of sleeves relative to each other.

15. A busbar arranged to electrically connect at least one power electronic module from at least one electrical conductor to which the busbar is able to be connected, wherein the busbar includes a plurality of coaxial sleeves, each sleeve including a plurality of arms that are distributed peripherally and radially around an axis of the sleeves, said plurality of arms extending longitudinally parallel to the axis, each arm comprising at least one conductive track forming one of the buses of the busbar;

wherein the respective arms of at least two sleeves are paired two by two by groups, each group of at least two paired arms forming at least an electrical connecting means with at least one of the respective electronic devices of the module.

16. The busbar according to claim 15, wherein at least some of the conductive tracks of the paired arms are coplanar.

17. The busbar according to claim 15, wherein the conductive tracks of each group of paired arms collectively form the surfaces of a regular polygon.

18. The busbar according to claim 15, wherein the conductive tracks of each group of paired arms are oriented toward the outside of the volume delimited between the set of arms.

* * * * *